(12) United States Patent
Bartley et al.

(10) Patent No.: US 7,036,709 B2
(45) Date of Patent: May 2, 2006

(54) METHOD AND STRUCTURE FOR IMPLEMENTING COLUMN ATTACH COUPLED NOISE SUPPRESSOR

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew B. Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 10/703,353

(22) Filed: Nov. 7, 2003

(65) Prior Publication Data

US 2005/0098607 A1    May 12, 2005

(51) Int. Cl.
*B23K 31/02* (2006.01)
*B23K 35/12* (2006.01)
*B23K 35/14* (2006.01)

(52) U.S. Cl. .............. 228/180.22; 228/245; 228/246; 228/56.3

(58) Field of Classification Search .............. None
See application file for complete search history.

(56) References Cited

U.S. PATENT DOCUMENTS

| | | | | |
|---|---|---|---|---|
| 3,744,129 A * | 7/1973 | Dewey, Jr. | ................ | 29/837 |
| 5,678,287 A * | 10/1997 | Smith et al. | ........... | 228/180.22 |
| 6,414,248 B1 * | 7/2002 | Sundstrom | ................ | 174/260 |
| 6,458,623 B1 * | 10/2002 | Goldmann et al. | ......... | 438/107 |
| 2003/0189083 A1 * | 10/2003 | Olsen | ........................ | 228/115 |

* cited by examiner

Primary Examiner—Lynne R. Edmondson
(74) Attorney, Agent, or Firm—Joan Pennington

(57) ABSTRACT

A method and structure are provided for implementing a column attach coupled noise suppressor for a solder column structure of the type used to join a substrate to a circuit card. The electrical noise suppressor structure includes a plurality of elongated through openings that are arranged in a predefined pattern. The elongated through openings have electrically conductive sidewalls and are electrically connected together. The predefined pattern of the elongated, electrically conductive through openings corresponds to a layout of solder columns. The solder columns are attached at one end to either a substrate or a circuit card and are inserted through the elongated through openings of the electrical noise suppressor structure, spaced apart from the electrically conductive sidewalls. Then the solder columns are attached at the other end to the other one of the substrate or circuit card.

16 Claims, 5 Drawing Sheets

METHOD AND STRUCTURE FOR IMPLEMENTING COLUMN ATTACH COUPLED NOISE SUPPRESSOR

FIELD OF THE INVENTION

The present invention relates generally to solder interconnection structures and, more particularly, to a method and structure for implementing a column attach coupled noise suppressor for a solder column structure, for example, used as a column grid array (CGA) to make second level solder connections in electronic components such as joining a substrate to a circuit card.

DESCRIPTION OF THE RELATED ART

In electronics systems there are various electronic components that require connection to other electronic components or to other levels of packaging. Examples include mounting of integrated circuit chips to a metallized substrate, multilayer ceramic substrate (MLC), laminate organic substrate, glass ceramic substrate, card (direct-chip-attach, DCA), and any substrate made of composite materials meeting thermal and mechanical properties. A second level surface mount technology, such as, a column grid array (CGA) or a ball grid array (BGA) typically is used to form an interconnection between a circuit board and an electronic module assembly such as a chip connected to a MLC.

The term ball grid arrays (BGAs) refers to a broad class of microelectronic substrate assemblies that are connected to the board/card with an array of solder balls. The use of solder to join materials such as components of an electronic structure is well known in the art. First interconnections formed by joining solder balls to a substrate assembly create the BGA. The BGA is subsequently joined to the card during assembly. Substantial differences in the thermal coefficient of expansion (TCE) can exist between the board and the substrate, as is the case when the substrate is made from a ceramic material, and the board is made from an epoxy-glass composite, for example, FR4. During thermal cycling (on-off cycles), such TCE differences cause plastic deformation of the solder ball interconnections. Accumulation of plastic strain with repeated thermal cycling ultimately leads to fatigue failure of the interconnections between the ceramic substrate and the board.

The actual fatigue life of a BGA decreases with increasing array size. Also, for a given array size, the fatigue life of a BGA is a function of the materials that comprise the substrate, board, and interconnections, and also the interconnection structure. The present trend towards higher powered packages, coupled with higher I/O counts, and larger interconnection arrays, creates a need for interconnections with improved fatigue life. Using solder column arrays instead of ball arrays provides desired improvement in fatigue life by allowing the interconnection length to increase with the enhancement in fatigue life in this case being due to the inverse relationship between interconnection length and accumulated plastic strain during thermal cycling.

Although solder column parts with 87 mils (0.087 inch) or about 2.2 millimeters (mm) tall columns are 10 times more reliable than ball grid arrays, some applications are being targeted toward smaller columns due to the added noise parasitic of the longer columns. The shorter column, typically 10 mils tall or less, is stiffer and does not bend as much as the longer column during the stress introduced by heating materials with different coefficients of thermal expansion, for example, ceramic substrates on FR4 cards or boards.

A significant disadvantage of the solder column attach over the solder ball attach is the electrical noise coupling between adjacent solder columns. It is desirable to have reliability comparable to the longer column along with the electrical advantages comparable to shorter solder columns or solder ball attach for some of the higher speed interfaces.

A need exists for a mechanism to provide comparable electrical advantages of ball grid arrays with the reliability of the longer columns, for example, 87 mils tall columns.

SUMMARY OF THE INVENTION

Principal objects of the present invention are to provide a method and structure for implementing a column attach coupled noise suppressor for a solder column structure, for example, used as a column grid array (CGA) to make second level solder connections in electronic components such as joining a substrate to a circuit card. Other important objects of the present invention are to provide such method and structure for implementing a column attach coupled noise suppressor for a solder column structure substantially without negative effect and that overcome some of the disadvantages of prior art arrangements.

In brief, a method and structure are provided for implementing a column attach coupled noise suppressor for a solder column structure of the type used to join a substrate to a circuit card. The electrical noise suppressor structure includes a plurality of elongated through openings that are arranged in a predefined pattern. The elongated through openings have electrically conductive sidewalls and are electrically connected together. The predefined pattern of the elongated, electrically conductive through openings corresponds to a layout of solder columns. The solder columns are attached at one end to either a substrate or a circuit card and are inserted through the elongated through openings of the electrical noise suppressor structure, spaced apart from the electrically conductive sidewalls. Then the solder columns are attached at another end to the other one of the substrate or circuit card.

In accordance with features of the invention, the electrical noise suppressor structure enables longer solder columns to be used allowing for reliability improvement without the impact of the added adjacent column coupled noise. The electrical noise suppressor structure significantly reduces the otherwise coupled noise between adjacent solder columns.

In one embodiment, the electrical noise suppressor structure is formed by an electrically insulative member including a plurality of metal plated vias defining the predefined pattern of the elongated through openings and the metal plated vias are electrically connected together by a conductive layer carried by the electrically insulative member.

In another embodiment, the electrical noise suppressor structure is formed by a grid of an electrically conductive material having a predefined depth defining the predefined pattern of the elongated through openings and the grid of electrically conductive material is coated with an electrically non-conductive material.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a method and structures are provided for implementing a column attach coupled noise suppressor for solder columns arranged, for example, as a column grid array (CGA) to make second level solder connections such as for joining a substrate to a circuit card. The column attach coupled noise suppressor structure of the preferred embodiments enable the use and reliability of longer solder columns, for example, 87 mils (0.087 inch) tall solder columns with substantially comparable electrical advantages of ball grid arrays. The column attach coupled noise suppressor structure of the preferred embodiments isolate each solder column in a solder column package from the other solder columns on the package.

Figure 1:
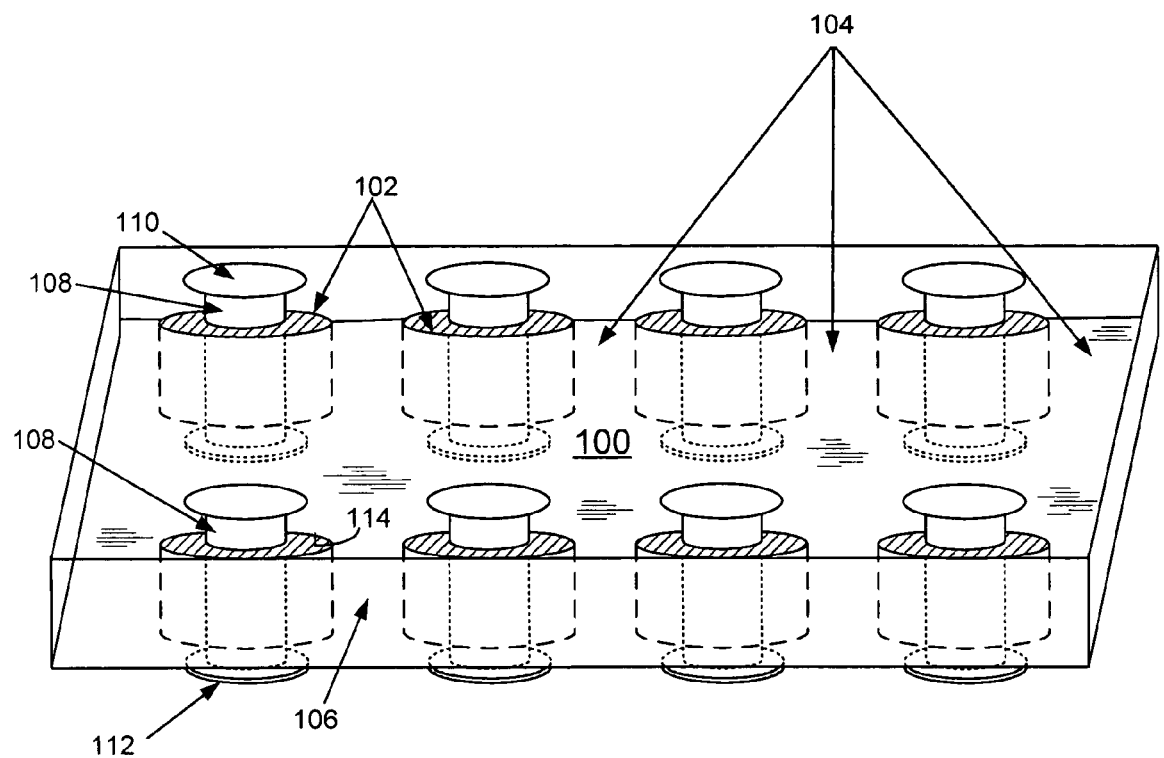
FIG. 1 is an isometric view not to scale with interior details shown in dotted line illustrating a structure and method for implementing a column attach coupled noise suppressor for a solder column grid array structure used to join a substrate to a circuit card after assembly in accordance with one preferred embodiment.
Figure 2:
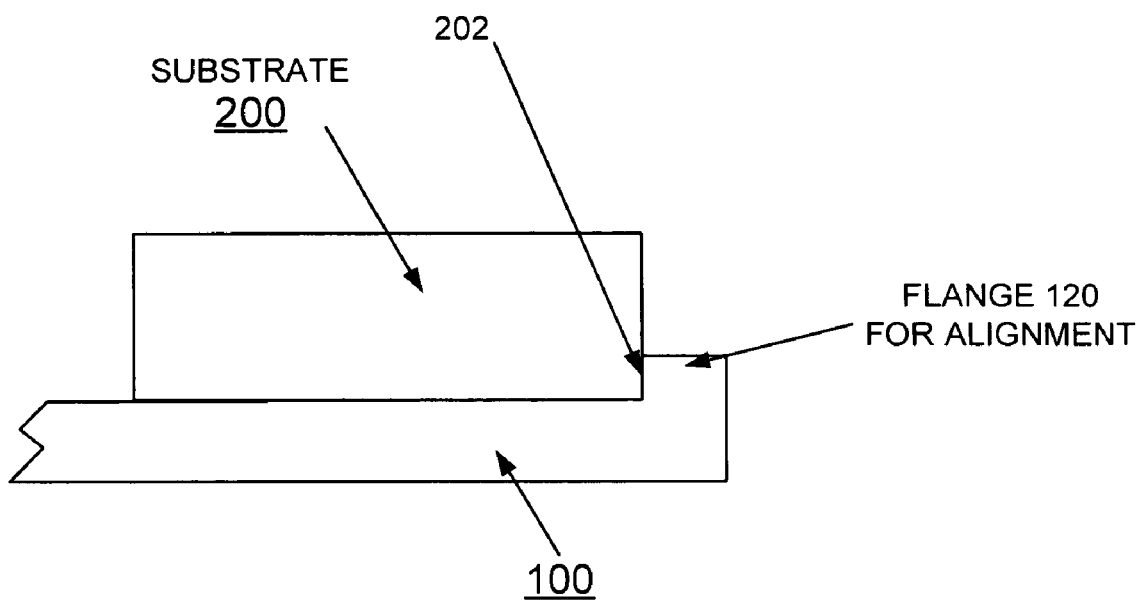
FIG. 2 is a side view illustrating alignment features of the column attach coupled noise suppressor structure and substrate of FIG. 1.

Having reference now to the drawings, in FIGS. 1–2, there is shown an electrical noise suppressor structure generally designated by the reference character 100 for use with solder columns in accordance with the preferred embodiment.

Electrical noise suppressor structure 100 includes a plurality of elongated, electrically conductive through openings or plated vias generally designated by the reference character 102 electrically connected together by a conductive layer or mesh 104 into one common electrical structure in accordance with the preferred embodiment. It should be understood that other structures or methods could be used to electrically connect the plated vias 102 together.

Electrical noise suppressor structure 100 is formed by an electrically non-conductive or insulative member generally designated by the reference character 106 with openings or through holes formed, for example, punched, laser drilled, or etched through the electrically insulative member 106 in a predefined pattern and then an interior through hole sidewall is plated with a continuous layer of a metal to provide the elongated, plated vias 102 corresponding to a predefined pattern of a plurality of elongated solder columns 108, typically present as an array. The conductive layer or mesh 104 is carried on or within the electrically insulative member 106 for electrically connecting the metal plated through openings 102. Solder column 108 is, for example, a column of solder wire used to effect the connection between a ceramic substrate 110 and a board 112 by a solder technique such as column grid array (CGA) attach technique.

Electrical noise suppressor structure 100 of a first preferred embodiment is used to significantly reduce the coupled noise between adjacent solder columns 108. Electrical noise suppressor structure 100 enables the longer column 108 to be used allowing for reliability improvement without the impact of the added adjacent column coupled noise.

An electrically conductive sidewall 114 of each elongated opening or plated via 102 is formed of an electrically conductive material selected from the group including, for example, copper, titanium, nickel, conductive doped silicon, platinum, palladium, rhodium, aluminum, tantalum, tungsten and titanium-tungsten. The electrically conductive sidewall 114 of each elongated, plated via 102 is deposited, for example, by conventional sputtering, evaporation, or chemical vapor deposition (CVD) processes to provide a very thin metal sidewall layer sufficient to provide electrical conductivity.

Solder column 108 is, for example, at least 87 mils tall and has a diameter of, for example, about 20 mils. The insulated structure 106 is an electrically nonconductive material, for example, a circuit card dielectric material, such as FR4, or ceramic dielectric. The elongated, electrically conductive through holes or plated vias 102 have a selected diameter for receiving the solder columns 108 spaced apart from the conductive sidewalls 114, for example, from about 35 mils to about 50 mils in diameter.

The solder columns 108 attached at one end to the substrate 110 are inserted through the elongated, electrically conductive openings 102 of the electrical noise suppressor structure 100, spaced apart from the electrically conductive sidewalls 114. Then the solder columns 108 are attached at the other end to the circuit card 112. It should be understood that solder columns 108 do not need to be circular in cross-section. It should be understood that the electrical noise suppressor structure 100 can be used with solder columns 108 having square or other cross-sections, for example, as required by load conditions and available substrate area.

It should be understood that the solder columns 108 alternatively are first attached at one end to the circuit card 112, then after being inserted through the elongated, electrically conductive openings 102 of the electrical noise suppressor structure 100 the solder columns 108 are attached at the other end to the substrate 110.

Referring now to FIG. 2, an exemplary alignment arrangement is provided by building a flange 120 into the top of the electrical noise suppressor structure 100 to allow a mating substrate 200 to nest into the structure 100. The flange 120 could extend all around the substrate 200, or simply provide alignment with substrate corners 202.

It should be understood that alignment of the electrical noise suppressor structure 100 could be achieved by various arrangements. For example, by optical alignment together with some form of adhesive or clip could be used to secure the electrical noise suppressor structure 100 to the targeted substrate 200. Also, standoffs could be formed into or attached to the electrical noise suppressor structure 100, for example, to keep the structure 100 closely spaced from the substrate 200 and to allow for cleaning and inspection of the card-to-substrate solder joints.

It should be understood that these standoffs in conjunction with an additional, insulated coating on the inside of the plated vias 102 could eliminate the alignment issue with the electrical noise suppressor structure 100 being generally self-aligning. Insulated coatings, such as Teflon and Liquid Crystal Polymers, could be used that would readily withstand the solder reflow temperatures that the electrical noise suppressor structure 100 would typically encounter.

Figure 3:
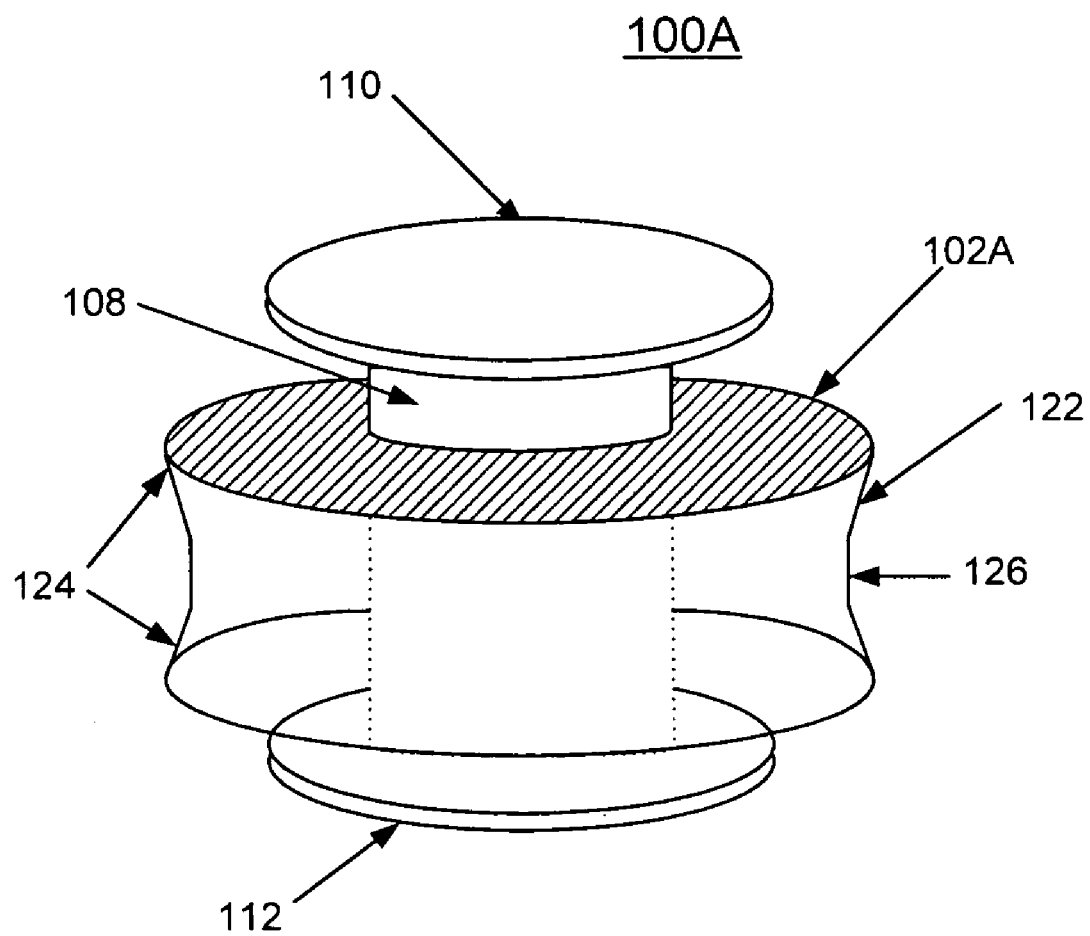
FIG. 3 illustrates an alternative via profile for the column attach coupled noise suppressor structure of FIG. 1.

Referring now to FIG. 3, there is shown an alternative column attach coupled noise suppressor structure generally designated by reference character 100A including an alternative profiled plated via 102A. The holes or plated vias 102A in the column attach coupled noise suppressor structure 100A have a predefined profile generally designated by reference character 122 to further reduce the likelihood that there could be a solder joint of solder column 108 which could either physically interfere with or short to the column attach coupled noise suppressor structure 102A. As shown, the predefined profile 122 of the plated vias 102A is tapered with larger diameters near opposed ends 124 of the plated vias 102A than near a central portion 126 of the plated vias 102A.

Figure 4A:
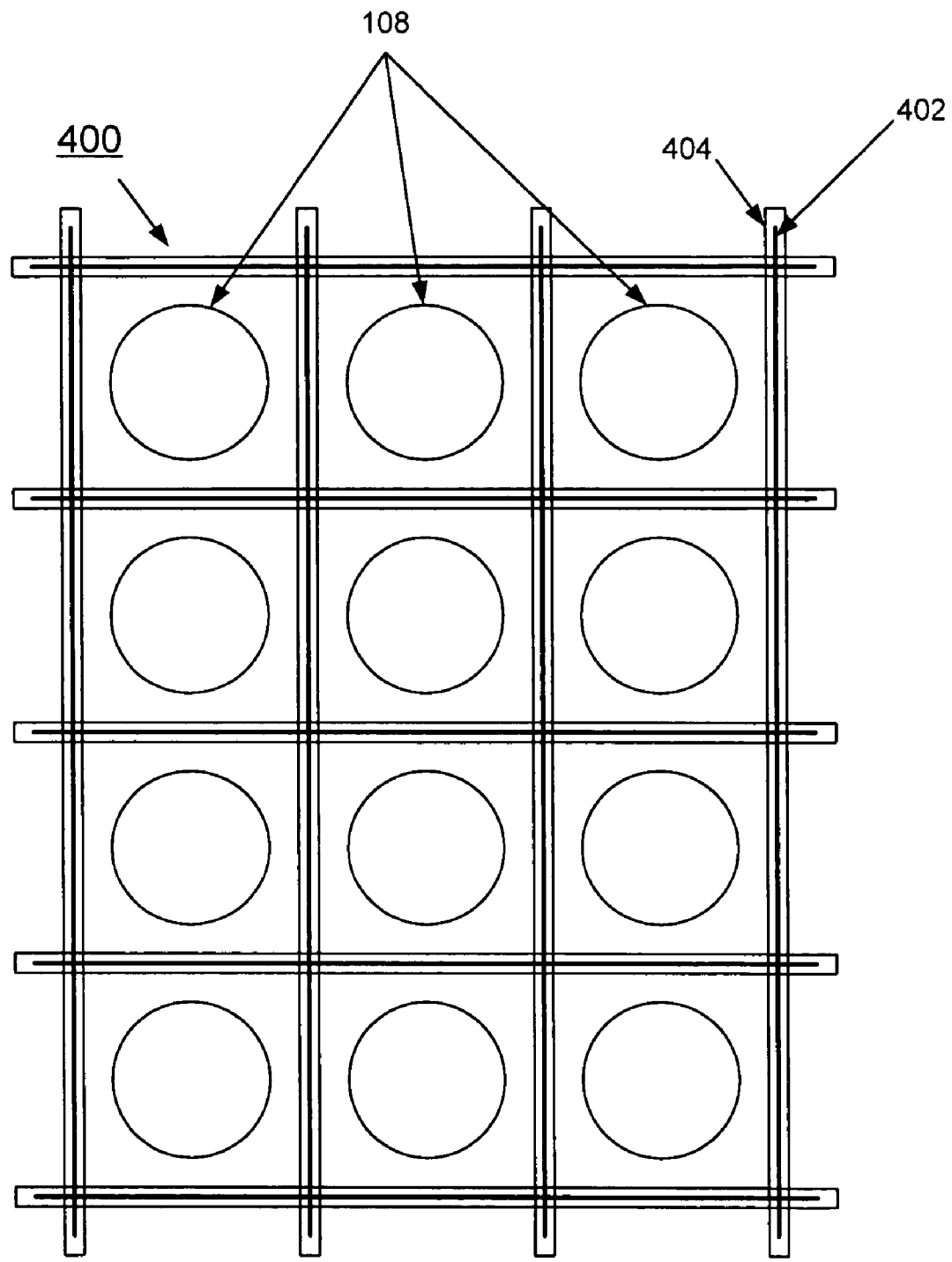
FIGS. 4A, and 4B illustrate another structure for implementing a column attach coupled noise suppressor in accordance with another preferred embodiment.
Figure 4B:
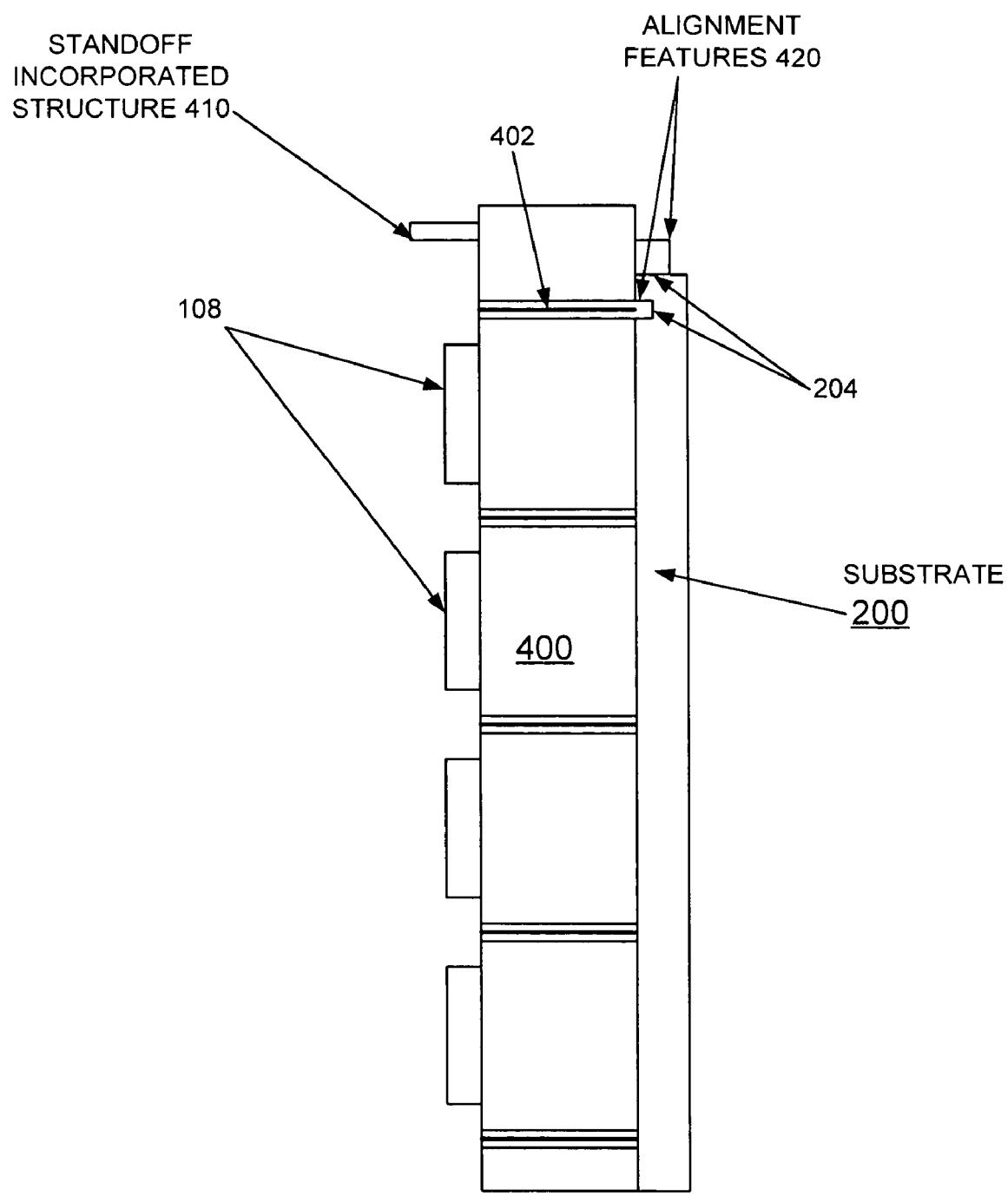

Referring now to FIGS. 4A and 4B, there is shown another structure for implementing a column attach coupled noise suppressor generally designated by reference character 400 in accordance with another preferred embodiment. The column attach coupled noise suppressor grid structure 400 includes an electrically conductive material or electrically conductive materials 402 forming a fence like electrically conductive structure with a predefined depth to isolate each solder column 108 from the other solder columns 108, as shown in FIG. 4B. The electrically conductive materials 402 are coated with an electrically non-conductive material 404 capable of withstanding typical eutectic solder attach temperatures.

The electrically conductive materials 402 are selected from the group including, for example, copper, titanium, nickel, conductive doped silicon, platinum, palladium, rhodium, aluminum, tantalum, tungsten and titanium-tungsten. The insulated coating material 404 can be implemented, for example, with Teflon or Liquid Crystal Polymers or other electrically non-conductive material that would withstand the solder attach temperatures the electrical noise suppressor structure 400 would typically encounter. A standoff 410 is formed into or attached to the electrical noise suppressor structure 400. Alignment features 420 are formed into or attached to the electrical noise suppressor structure 400 that cooperate with alignment features 204 of the substrate 200.

One additional benefit is that the column attach coupled noise suppressor structures 100, 100A, and 400 of the preferred embodiments function as a protective device during shipping and handling to keep the solder columns 108 from being damaged.

While the present invention has been described with reference to the details of the embodiments of the invention shown in the drawing, these details are not intended to limit the scope of the invention as claimed in the appended claims.

What is claimed is:

1. A method for implementing a column attach coupled noise suppressor for a solder column structure of the type used to join a substrate to a circuit card comprising the steps of:
   providing an electrical noise suppressor structure having a plurality of elongated through openings arranged in a predefined pattern corresponding to a layout of solder columns; said elongated through openings having electrically conductive sidewalls and being electrically connected together;
   inserting said solder columns through the elongated through openings of the electrical noise suppressor structure, spaced apart from the electrically conductive sidewalls with said solder columns being attached at one end to one of the substrate or the circuit card; and
   attaching said solder columns at another end to the other one of the substrate or the circuit card.

2. A method for implementing a column attach coupled noise suppressor as recited in claim 1 wherein the step of providing said electrical noise suppressor structure includes the steps of forming holes through an electrically insulative member to provide said predefined pattern of said elongated through openings; and depositing an electrically conductive material on sidewalls of said elongated through openings.

3. A method for implementing a column attach coupled noise suppressor as recited in claim 2 wherein the step of forming holes through said electrically insulative member includes the steps of forming tapered holes having larger diameters near opposed ends than near a central portion.

4. A method for implementing a column attach coupled noise suppressor as recited in claim 2 includes the steps of providing an electrically conductive layer associated with said electrically insulative member for electrically connecting said elongated through openings.

5. A method for implementing a column attach coupled noise suppressor as recited in claim 2 wherein the step of forming holes includes a selected one of punching, laser drilling, or etching said through openings in said electrically insulative member.

6. A method for implementing a column attach coupled noise suppressor as recited in claim 2 wherein the step of depositing said electrically conductive material on sidewalls of said elongated through openings includes the step of using a selected one of sputtering, evaporation, or chemical vapor deposition (CVD) processes to provide a thin metal sidewall layer sufficient to provide electrical conductivity.

7. A method for implementing a column attach coupled noise suppressor as recited in claim 1 wherein said electrically conductive sidewalls are formed of an electrically conductive material selected from the group of copper, titanium, nickel, conductive doped silicon, platinum, palladium, rhodium, aluminum, tantalum, tungsten and titanium-tungsten.

8. A method for implementing a column attach coupled noise suppressor as recited in claim 1 wherein the step of providing said electrical noise suppressor structure includes the steps of forming a grid of an electrically conductive material with a predefined depth.

9. A method for implementing a column attach coupled noise suppressor as recited in claim 8 includes the steps of coating said grid of said electrically conductive material with an electrically non-conductive material.

10. A structure for implementing a column attach coupled noise suppressor for a solder column structure of the type used to join a substrate to a circuit card comprising:
    an electrical noise suppressor structure having a plurality of elongated through openings arranged in a predefined pattern corresponding to a layout of solder columns; said elongated through openings having electrically conductive sidewalls and being electrically connected together;
    said solder columns received through the elongated through openings of the electrical noise suppressor structure, spaced apart from the electrically conductive sidewalls; and said solder columns having opposed ends being respectively attached to the substrate and the circuit card.

11. A structure for implementing a column attach coupled noise suppressor as recited in claim 10 wherein said electrical noise suppressor structure includes an electrically insulative member including a plurality of metal plated vias defining said predefined pattern of said elongated through openings and said metal plated vias being electrically connected together by a conductive layer carried by said electrically insulative member.

12. A structure for implementing a column attach coupled noise suppressor as recited in claim 10 wherein said electrical noise suppressor structure includes a grid of an electrically conductive material having a predefined depth defining said predefined pattern of said elongated through openings; and said grid of said electrically conductive material being coated with an electrically non-conductive material.

13. A structure for implementing a column attach coupled noise suppressor as recited in claim 10 wherein said electrically conductive sidewalls are formed of an electrically conductive material selected from the group of copper, titanium, nickel, conductive doped silicon, platinum, palladium, rhodium, aluminum, tantalum, tungsten and titanium-tungsten.

14. A structure for implementing a column attach coupled noise suppressor as recited in claim 10 wherein said elongated through openings have a predefined profile with larger diameters near opposed ends of said elongated through openings than near a central portion of said elongated through openings.

15. A structure for implementing a column attach coupled noise suppressor for a solder column structure of the type used to join a substrate to a circuit card comprising:

an electrical noise suppressor structure having a plurality of elongated through openings arranged in a predefined pattern corresponding to a layout of solder columns; said elongated through openings having electrically conductive sidewalls and being electrically connected together; said electrical noise suppressor structure includes alignment features for alignment with cooperating features of the substrate or the circuit card;

said solder columns received through the elongated through openings of the electrical noise suppressor structure, spaced apart from the electrically conductive sidewalls; and said solder columns having opposed ends being respectively attached to the substrate and the circuit card.

16. A structure for implementing a column attach coupled noise suppressor as recited in claim 10 wherein said electrical noise suppressor structure includes at least one standoff for spacing apart said electrical noise suppressor structure from the substrate or the circuit card.

* * * * *